United States Patent [19]
van den Berg

[11] Patent Number: 5,512,107
[45] Date of Patent: Apr. 30, 1996

[54] ENVIRONMENTALLY STABLE THIN-FILM SOLAR MODULE

[75] Inventor: Robert van den Berg, Munich, Germany

[73] Assignee: Siemens Solar GmbH, Munich, Germany

[21] Appl. No.: 302,896

[22] PCT Filed: Mar. 9, 1993

[86] PCT No.: PCT/DE93/00217

§ 371 Date: Sep. 19, 1994

§ 102(e) Date: Sep. 19, 1994

[87] PCT Pub. No.: WO93/19491

PCT Pub. Date: Sep. 30, 1993

[30] Foreign Application Priority Data

Mar. 19, 1992 [DE] Germany ............. 42 08 950.6

[51] Int. Cl.[6] .................................. H01L 31/048
[52] U.S. Cl. ............. 136/251; 136/244; 136/265
[58] Field of Search ........................... 136/244, 251, 136/256, 265

[56] References Cited

U.S. PATENT DOCUMENTS 4,316,049  2/1982  Hanak ..................... 136/244

FOREIGN PATENT DOCUMENTS 0204562  12/1986  European Pat. Off. ...... 136/249 TJ
0246027  11/1987  European Pat. Off. ...... 136/251
3-34472   2/1991   Japan ..................... 136/244
4-94174   3/1992   Japan ..................... 136/244

OTHER PUBLICATIONS

H. C. Weller et al., "Novel Type of AnO Studied in Combination with 1.5eV a–SiGe:H PIN Diodes", 22nd Second IEEE Photovoltaic Specialists Conference, Oct. 1991, Las Vegas, Nevada, USA, pp. 1290–1295.

R. H. Mauch et al., "Highly Transparent and Conductive ZnO:Al Thin Films for Photovoltaic Applications", Tenth E.C. Photovoltaic Solar Energy Conference, Apr. 1991, Lisbon, Portugal, pp. 88–91.

S. R. Praschek et al., "Laser Patterning of A–SI Solar Modules with Transparent Conducting Zinc Oxide Back Electrodes", 22nd IEEE Photovoltaic Specialists Conference, Oct. 1991, Las Vegas, Nevada, USA, pp. 1285–1289.

Primary Examiner—Aaron Weisstuch
Attorney, Agent, or Firm—Hill, Steadman & Simpson

[57] ABSTRACT

A thin-film solar module includes a transparent substrate, at least one active semiconductor layer (3) made of a I-III-VI2 semiconductor (chalcopyrite) having a diode structure, the semiconductor layer being patterned into strip-shaped individual solar cells, electrode patterns made of aluminum-doped zinc oxide (ZnO:Al) having a hexagonal crystal structure as front and rear contacts and for integrated interconnection of the solar module, and an epoxy coating layer as a rear covering.

4 Claims, 1 Drawing Sheet

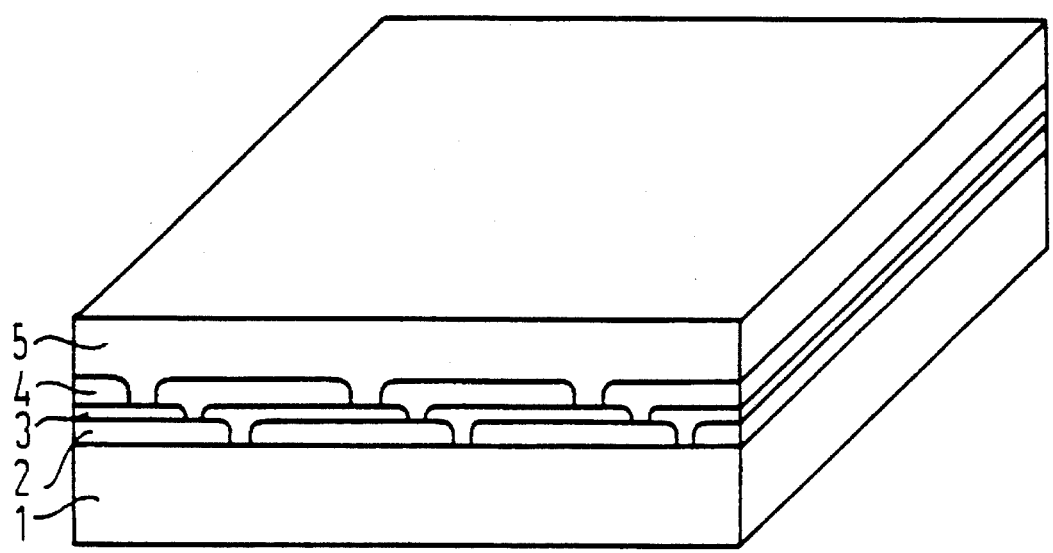

ENVIRONMENTALLY STABLE THIN-FILM SOLAR MODULE

BACKGROUND OF THE INVENTION

1. Field of the Invention

The present invention relates generally to a thin film solar module and, more particularly, to the contact layers in a solar module.

2. Description of the Related Art

Thin-film solar modules made of amorphous silicon are fabricated directly on large-area substrates made of (glass or metal. To this end, an all-over contact layer (front contact) of transparent, conductive oxides (TCO) is first deposited on the substrate, above which a photoactive layer is generated which is then covered with a further, usually transparent, contact layer as the rear contact. In order to provide a suitable voltage, the thin-film solar module is subdivided into strip-shaped individual cells interconnected in series. By suitable patterning of each individual layer directly after its deposition, the layer generation and electrical interconnection form an integrated device.

The current-carrying electrodes (front and rear contacts) play a decisive part, since both their optical and their electrical properties determine the efficiency of each individual cell and the module as a whole.

The optical properties of the front contact layer, such as its transparency and light scattering properties, affect the amount of the light that reaches the photoactive layer, and thus also the photocurrent.

The electrical properties (such as contact potential and resistivity) are responsible for the discharge of the photocurrent that has been generated. The resistivity of the contact material leads to ohmic losses in the solar module.

The use of zinc oxide (ZnO) as a material for the front contacts on transparent substrates makes it possible, within certain limits, to adjust the morphology of the contact layers, which permits optimization of the quantity of the light that reaches the active semiconductor layer and an improvement in the short-circuit current of the individual cells. In order to increase the conductivity, zinc oxide layers are doped, for example with boron. If the same material is also used for the rear contact, semitransparent solar modules can be fabricated and used as the top cell in a tandem module, as a roof glazing for cars, or as glazing in the construction industry (for example as a facade module or window module).

Unprotected thin-film solar cells or modules having front and rear contacts made of boron-doped zinc oxide (ZnO:B) are found, however, not to be environmentally stable. If they have been exposed, for prolonged periods and simultaneously, to elevated temperature and humidity, this results in irreversible increases of the sheet resistance of the contact layers, especially in the externally situated rear contact. Consequently, the series resistance of the solar cell or the solar module changes, which leads directly to losses in the maximally extractable output of the module.

In known solar modules made of amorphous silicon and having front and rear contacts made of ZnO:B, the contact layers are protected against the action of humidity by being hermetically sealed. To this end there is laminated onto the rear contact, for example by means of a PVB film [poly(vinyl butyral)], a further glass sheet. To provide an outer humidity barrier, the glass package, with the solar cells situated therebetween, is coated at its rim with a polyurethane frame. For non-transparent solar cells there is applied, directly to the rear contact, as an additional water vapor barrier, an epoxy coating which at the same time serves as a residual-light reflector.

This hermetic sealing, which is required for the solar modules, of the thin layers requires a large outlay in terms of materials and labor, which leads to a considerable increase in manufacturing costs. But even with the sealing it is not possible to protect the sensitive layers completely against the penetration of moisture. The modules exhibit, in accelerated environmental tests (1000 hours at 85° C. and 85 percent humidity, Qualification Test Procedure for Photovoltaic Thin Modules, Spec. No. 701, Test B13, JRC, 21020 Ispra (Va)-Italy) considerable losses, in part, in the maximum output, which can be ascribed to the penetration of water vapor into the module construction.

A contribution by S. R. Praschek et al. to the 22nd IEEE Photovoltaic Specialists Conference, Las Vegas, Nevada (USA), October 7th to 11th 1991, pages 1285 to 1289, discloses a pattern for a thin-film solar module made of amorphous silicon which is based on a glass substrate and employs front and rear contacts of zinc oxide.

EP-A-246 027 discloses a thin-film solar module of amorphous silicon which is based on a fluorocarbon film as the substrate. For the front and rear contacts, any conductive oxide is proposed, especially zinc oxide doped with hydrogen or an element of the third main group. Employed for the rearside covering are films of polyester, Teflon™ or Tedlar™.

EP-A-204 562 discloses a transparent thin-film solar module which is proposed for use as a facade element for a building or as the roof for a vehicle. The module is based on a glass substrate, has an indium tin oxide rear electrode and a rear covering made of a further glass sheet.

In a contribution by R. H. Mauch and H. W. Schock to the 10th E. C. Photovoltaic Solar Energy Conference, Lisbon, Portugal, April 8th to 12th 1991, pages 88 to 91, aluminum-doped zinc oxide is proposed for use as the window layer for solar modules.

U.S. Pat. No. 4,316,049 discloses a module, interconnected in series, composed of individual tandem solar cells made of amorphous silicon. Interconnection of the individual sells is effected via metallic rear contacts.

SUMMARY OF THE INVENTION

An object of the present invention is therefore to provide a thin-film solar module which exhibits increased environmental stability and at the same time requires a reduced packaging cost and effort.

This and other objects and advantages are achieved according to the invention by a solar module having a transparent substrate, at least one active semiconductor layer made of a I-III-VI2 semiconductor (chalcopyrite) having a diode structure, the semiconductor layer being patterned into strip-shaped individual solar cells; also including electrode patterns made of aluminum-doped zinc oxide (ZnO:Al) having a hexagonal crystal structure as front and rear contacts and for integrated interconnection of the solar module, and including an epoxy coating layer as a rear covering.

Further refinements of the invention and an application according to the invention of the novel modules include a plurality of superposed active semiconductor layers to form a stacked module.

In a preferred embodiment of the solar module, the aluminum concentration in the electrode patterns is from 0.5 to 6 atomic percent.

The solar module preferably has a transparent coating as a rear covering.

In one application the solar module is used as a roof glazing for a motor vehicle. In another application, the solar module is used as an element for facade facing.

It has been found that thin-film solar cells, fabricated for test purposes, having rear contact patterns of aluminum-doped zinc oxide without a coating layer as a rear covering have excellent humidity-heat resistance and survive the environmental test, described above in more detail, virtually unchanged. Even after this long-term exposure to humidity and heat, the solar cells show only an insignificant increase in the sheet resistance and thus no loss at all in the maximally achievable output.

It is thus possible, in the solar module according to the invention, to dispense with costly lamination with a plastic film, let alone a further glass sheet. Likewise, sealing the module with a frame is superfluous. The coating that is applied particularly for mechanical protection of the rear contact is sufficient for sealing. The invention therefore represents a considerable simplification of the structure, compared with known thin-film solar modules, and results in major savings in terms of material and production costs.

Zinc oxide as the electrode material for front and rear contacts has the advantage that its morphology and thus, in particular, the optical properties can be readily adjusted, and can be optimized with respect to the solar cell or the module. High transmission and, with a suitable morphology, efficient launching of light and an attendant high short-circuit current in the module are achieved. Compared with the boron-doped zinc oxide, known for thin-film solar modules, as the electrode material, the aluminum-doped zinc oxide has a sheet resistance which is reduced by more than a factor of 3.

The contacts can be fabricated, for example, by sputtering, resulting in an extremely homogeneous distribution of the dopant in the ZnO:Al material. This ensures homogeneous layer properties over the entire module area. The targets employed can be zinc/aluminum mixed targets in a reactive oxygen-containing atmosphere, or zinc oxide/aluminum mixed targets in an inert atmosphere. Preference is given to the second alternative, however, since it ensures better process control and thus better reproducibility in the fabrication of the contacts. The substrate temperature is preferably set to a value of greater than 300° C., for example 350° C. This leads to the formation of a uniformly hexagonal crystal structure in the zinc oxide which exhibits the best stability with respect to environmental influences and whose properties remain unchanged even after a plasma treatment.

The thin-film solar module according to the invention is suitable for all photoactive semiconductors which can be deposited over large areas, especially for amorphous silicon, silicon-germanium alloys, chalcopyrites (I-III-VI2 semiconductors) or alternatively for multilayer modules such as tandem cells or stacked cells having individual cells consisting of identical or different materials.

The modules can be fabricated so as to be semitransparent, it being possible to use as the rear covering a clear epoxy coating, for example. For the purpose of increased light absorption in the module, however, the coating layer of the rear covering is provided as a reflection layer, which purpose may likewise be served by a suitably chosen epoxy coating.

To these ends, for example, titanium oxide (TiO2) may be contained as the pigment in a consequently white epoxy coating. The coating should have good reflector properties for the red fraction of the incident radiation and, for diffuse reflection, should be matt rather than glossy.

BRIEF DESCRIPTION OF THE DRAWINGS

The invention is explained below in more detail with reference to a specific embodiment and the accompanying figure.

The figure shows a thin-film solar module according to the invention in schematic cross section.

DETAILED DESCRIPTION OF THE PREFERRED EMBODIMENTS

Over the entire area of a glass substrate 1, an aluminum-doped zinc oxide layer having a thickness of 1.5 µm is deposited as the front contact 2 and is then patterned by means of a laser to produce narrow electrode strips 2.

A PECVD process is employed to generate, on top of this over the entire area, the active semiconductor layer 3 made of amorphous silicon (a-Si:H) having a p-i-n structure in a thickness of, for example, 300 nm. Likewise by means of a laser, the active semiconductor layer is patterned parallel to the strip-shaped electrodes of the front contact layer 2, but offset by at least one trench width with respect to the front contacts.

In the same way as the front contacts 2, a rear contact 4 is deposited over the entire area to a thickness of approximately 1.5 µm and is patterned, for example by means of a laser. The pattern line (trench) is offset by a further trench width with respect to the pattern line of the active semiconductor layer 3.

Finally, the individual solar cells which are electrically connected in series are provided with external terminals, and the module is sealed by covering with a layer 5 approximately 20 to 30 µm thick of epoxy coating. The finished solar module shown in the figure is extremely stable in terms of humidity and the effect of temperature and in accelerated environmental tests does not show any losses in the maximally achievable output.

The solar module according to the invention is therefore eminently suitable for use as a roof glazing of cars, for facade facing of buildings or as a power module in extreme climatic zones (for example tropics), since it withstands even extreme weather conditions.

Although other modifications and changes may be suggested by those skilled in the art, it is the intention of the inventor to embody within the patent warranted hereon all changes and modifications as reasonably and properly come within the scope of his contribution to the art.

I claim:

1. A thin-film solar module, comprising:

a transparent substrate, at least one active semiconductor layer made of a I-III-VI2 semiconductor having a diode structure, said semiconductor layer being patterned into strip-shaped individual solar cells;

electrode patterns made of aluminum-doped zinc oxide having a hexagonal crystal structure as front and rear contacts and for integrated interconnection of the solar cells, and an epoxy coating layer as a rear covering on said solar module.

2. A solar module as claimed in claim 1, further comprising:

a plurality of superposed active semiconductor layers.

3. A solar module as claimed in claim 1, wherein the aluminum concentration in the electrode patterns is from 0.5 to 6 atomic percent.

4. A solar module as claimed in claim 1, wherein said epoxy coating layer which is said rear coating is transparent.

* * * * *